United States Patent [19]

Tower et al.

[11] Patent Number: 4,547,624
[45] Date of Patent: Oct. 15, 1985

[54] METHOD AND APPARATUS FOR REDUCING PACKAGE HEIGHT FOR MICROCIRCUIT PACKAGES

[75] Inventors: Steven A. Tower, North Dartmouth; Jay S. Greenspan, South Dartmouth, both of Mass.

[73] Assignee: Isotronics, Inc., New Bedford, Mass.

[21] Appl. No.: 557,640

[22] Filed: Dec. 2, 1983

[51] Int. Cl.$^4$ .......................... H05K 5/04; H01L 39/02
[52] U.S. Cl. ............................. 174/52 FP; 174/52 S; 29/588
[58] Field of Search .................. 174/52 S, 52 FP; 357/74; 29/588

[56] References Cited

U.S. PATENT DOCUMENTS

| | | | |
|---|---|---|---|
| 4,008,945 | 2/1977 | Scherer | 174/52 FP X |
| 4,262,300 | 4/1981 | Scherer | 357/74 |
| 4,266,089 | 5/1981 | Scherer | 357/74 X |
| 4,266,090 | 5/1981 | Scherer | 357/74 X |
| 4,331,253 | 5/1982 | Gordon et al. | 29/588 X |
| 4,412,093 | 10/1983 | Wildeboer | 174/52 FP |
| 4,451,540 | 5/1984 | Baird et al. | 174/52 FP X |
| 4,453,033 | 6/1984 | Duff et al. | 174/52 FP |

*Primary Examiner*—A. T. Grimley
*Assistant Examiner*—Terry Flower
*Attorney, Agent, or Firm*—Weingarten, Schurgin, Gagnebin & Hayes

[57] ABSTRACT

An offset weld ring is brazed or soldered to the top surface of a flat pack frame to provide an offset weld surface for the welding of a lid to the package in which the heat applied during the welding process is moved away from the glass feedthroughs in the package, thereby permitting closer spacing of the lid to the glass feedthrough for minimizing overall package height and obtaining a low profile package.

12 Claims, 10 Drawing Figures

METHOD AND APPARATUS FOR REDUCING PACKAGE HEIGHT FOR MICROCIRCUIT PACKAGES

FIELD OF INVENTION

This invention relates to microcircuit packages and more particularly to a method and apparatus for minimizing package height.

BACKGROUND OF THE INVENTION

Integrated circuit packaging has developed to the point that integrated circuits or microcircuits may be hermetically sealed into a package called a "flat pack" which comprises a base secured to a rectangular ring, with the microcircuit located on the base within the ring. The sides of the ring are provided with glass feedthroughs which are utilized to insulate and seal leads passing therethrough to the interior of the ring. In some instances, the interior ends of the leads form contact pads which are bonded to corresponding pads on the microcircuits so that electrical connection can be made to and from the microcircuit. In other instances, conventional wire bonding is utilized.

The height or profile of the so-called flat packs is in major part determined by the spacing between the topmost portion of the glass feedthrough and the lid or cover for the flat pack. In general, for a 40 mil wall thickness ring, the lid, if it is to be welded to the ring, must be at least 40 thousandths of an inch from the top of the glass feedthrough to prevent damage to the feedthrough due to the heat generated during welding. For thinner walls, such as for instance 30 thousandths of an inch, successful damage free welding requires that the lid be at least 50 thousandths of an inch from the glass feedthrough. It will therefore be appreciated that the package height is dependent upon a required spacing when welding techniques are utilized to secure the lid to the package.

Welding is desirable both because it is inexpensive and because the hermeticity achievable with welded lids far exceeds that of solder-based systems. Additionally, processing yields utilizing welding are considerably higher than the yields associated with soldering.

While nonweldable packages may have their respective heights or profiles reduced through the utilization of lids soldered to respective rings, soldering is both expensive in terms of process time and also in terms of the coating materials necessary for the soldering process. For instance, to achieve hermetic seals with standard processing techniques, both the package and the lid must be flash coated with gold, obviously an expensive metal. Nickel, on the other hand, is considerably less expensive but is not suitable for soldered flat packs.

While U.S. Pat. Nos. 4,331,258; 4,331,253; 4,262,300; 4,227,036; 4,192,433; 4,149,910; 4,135,038; 3,945,557; 3,874,549; 3,848,077; 3,823,468; 3,774,232; 3,768,144; 3,676,569; 3,669,715; 3,663,868; 3,648,357; 3,548,076; 3,538,597; 3,435,516; 3,423,638; and 3,349,481 all illustrate methods and apparatus for sealing flat packs, none of the above patents teaches limiting the height of a flat pack with a welded lid, nor means for preventing damage to glass feedthroughs when utilizing conventional welding.

Reference is made to U.S. Pat. No. 3,539,704 which shows the utilization of an annular lip of a ring sidewall to which is welded a bottom or cover. This patent is, however, directed to leadthrough assemblies having a plurality of passages in the leadthrough panel which extend at a 45° angle to the plane of the enclosure, with the leadthrough panel being further provided with a stress decoupling area around the flange portion. It will be appreciated that the flange is integral to the ring of the package and is flexible at the bend for stress relief purposes. Because of the 45° angle at which the leads enter the package, this patent is not concerned with minimizing package height, nor with the removal of heat from the leadthrough area. The 45° angle of the leads is primarily used to reduce the stresses on the leadthrough assembly by reducing the amount of bending required on the conductors for connecting them to the adjoining circuitry. It can thus be seen that mechanical stress relief is what is covered by the above patent. Moreover, the stress relief is provided for the specific purpose of relieving the stresses normally attending a "cold weld" process. "Cold welding" does not provide the damaging heat of the conventional welding process. Neither does it provide for the required hermeticity or yields for flat packages.

SUMMARY OF THE INVENTION

In order to minimize package height to provide a low profile package, the rectangular frame or ring is provided with a generally rectangular ring around its top surface which provides an outwardly extending flange to which a lid is welded with a conventional welding process. The weld bead is made as far out on the flange as possible so that heat applied during the welding process is dissipated prior to its having any effect on the glass feedthroughs which pass through the rectangular frame or ring. This in turn permits the spacing between the topmost part of the glass feedthrough and the lid to be considerably reduced while at the same time providing a welded package. The offset weld ring is first brazed or soldered to the top surface of the package frame or ring, with the lid then being welded at the periphery of the weld ring. In one embodiment, with a frame of Kovar-ASTM-F15 alloy ni-iron-cobalt, with 40 mil thick frame or ring wall and with an offset ring of Kovar having a 10 mil edge thickness, and a 50 mil flange width, then the distance between the top of the glass feedthrough and the lid can be reduced from the aforementioned 40 thousandths of an inch to as little as 15 thousandths of an inch. This provides an overall height for the flat pack which is greatly reduced over other flat packs which are sealed by conventional welding techniques.

Note, the weld ring need not extend beyond the frame walls on sides which are not provided with leads.

The use of the conventional welding technique not only provides for greater yields and lower cost, but also obviates the necessity of providing a solder system in which gold plating or gold eutectics must be utilized.

In one embodiment, package height is further reduced by providing a stepped lid with a reduced thickness peripheral edge, whereas in another embodiment an annular weld projection is provided about the periphery of the annular offset weld ring.

It has been found that the wider the offset portion of the weld ring the closer can be the spacing between the weld ring and the glass feedthrough. For flanges of 50 thousandths of an inch width, it is possible to locate the bottom surface of the weld ring virtually on top of the glass feedthrough without affecting the feedthrough integrity.

BRIEF DESCRIPTION OF THE DRAWINGS

These and other features of the subject invention will be better understood in connection with a detailed description taken in conjunction with the drawings of which.

DETAILED DESCRIPTION

As described, an offset weld ring is brazed to the top surface of a flat pack frame to provide an offset weld surface for the welding of a lid to a flat pack such that heat applied during the welding process is moved away from the glass feedthroughs in the flat package. This permits closer spacing of the lid to the glass feedthrough for minimizing overall package height and obtaining a low profile package.

Figure 1:
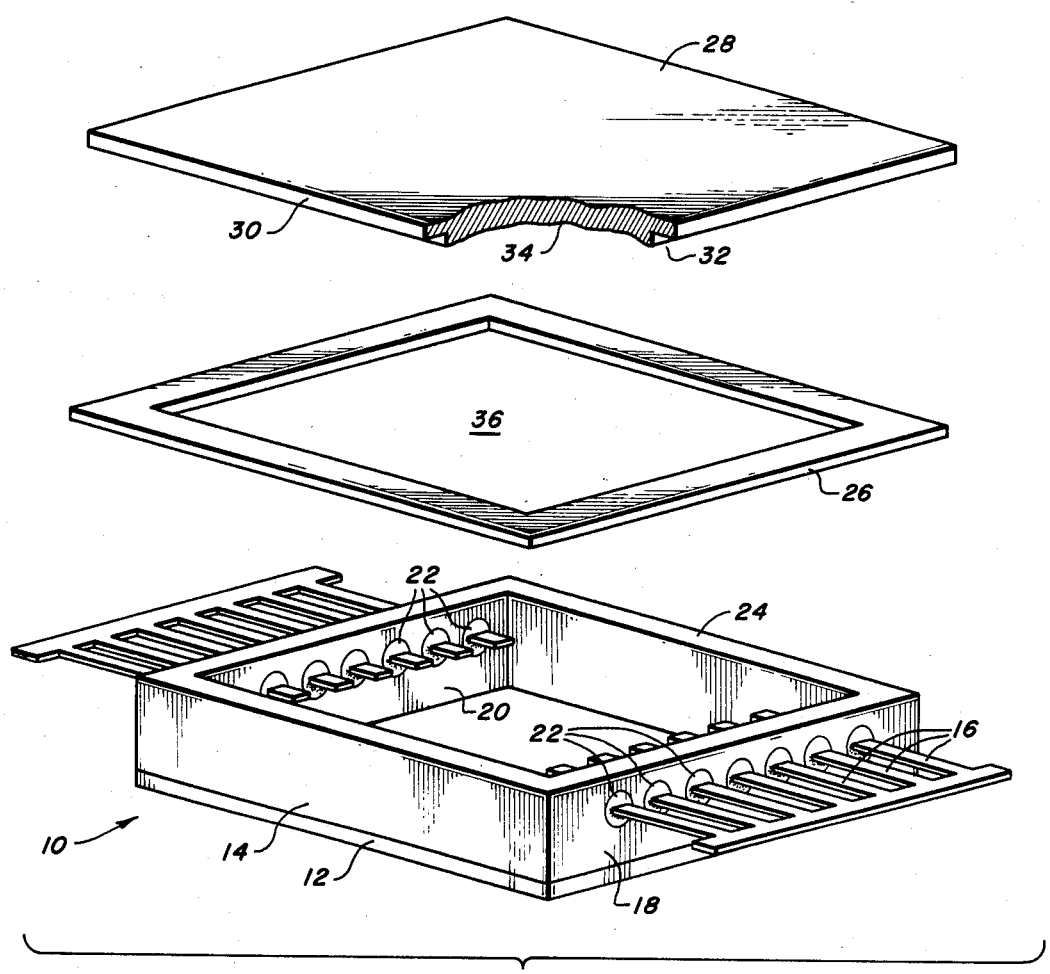
FIG. 1 is an exploded view of the subject invention illustrating a flat pack with an intermediate oversized ring positioned between the top surface of the flat pack frame and the lid therefor.

Referring now to FIG. 1, a flat pack 10 is shown as generally including a rectangular base 12 and a corresponding frame or ring 14 having leads 16 passing through opposing sidewalls 18 and 20 via feedthroughs 22 which are in the usual instance made of glass or ceramic. The feedthroughs serve not only to electrically isolate the leads from the package frame but also to seal the leads to the frame. In the usual embodiment, the base material may be made of a variety of different metals or alloys such as cold rolled steel, stainless steel, or 42 alloy, an alloy of nickel and iron, whereas in the preferred embodiment the frame is made of so-called Kovar (ASTMF-15 alloy) which is a nickel, cobalt alloy having 17% cobalt, 54% iron and 29% nickel. Frame 14 has an annular top surface 24 to which is brazed a generally rectangular offset ring 26 with the brazing materials being selected based on the alloy used for the frame and the lid material. In a preferred embodiment, the Kovar being preferred for the frame, offset ring 26 is also made of Kovar and is brazed to the Kovar frame through the utilization of a copper or other braze or high temperature soldering technique. It will be appreciated that the frame lid and seal ring materials may be of dissimilar metals.

After the brazing of the offset ring to the frame, a lid generally indicated at 28 is welded to ring 26 at its periphery through a conventional welding process. In such a system a seam weld is used to seal the lid on a flat package. This is accomplished by performing a series of overlapping spot welds simultaneously on opposite sides of the lid through the use of opposed roller electrodes which run around the periphery of the lid. The welder's electrodes stay in constant contact with the lid and more continuously while the power supply is rapidly pulsed. In one embodiment the rollers are canted inwardly to provide a beveled weld head.

In order to minimize package height, the thickness of the edge 30 of lid 28 may be reduced by providing circumferential notch 32 such that the lid when positioned over the offset ring has an interior portion 34 which projects down into the aperture 36 of offset ring 26.

Figure 2:
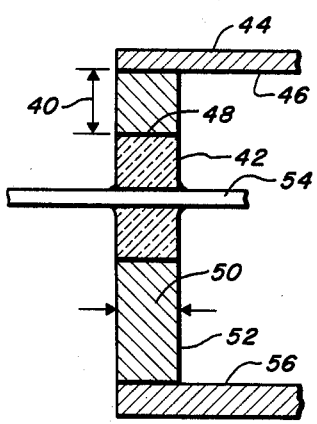
FIG. 2 is a cross-sectioal view of a prior art flat package indicating the required distance between the feedthrough and the lid when the lid is welded to the flat pack frame.

While the overall package height is primarily controlled by the size of the components carried within the package and therefore the height of the feedthrough from the base, as well as the thickness of the base, for hermetically sealed packages which are to be welded, there is a minimum distance as illustrated in FIG. 2 by double ended arrow 40 which comprises the spacing between the feedthrough 42 and the lid 44 such that the bottom surface of lid 44 is spaced above the topmost portion 48 of feedthrough 42 by the distance 40. Conventional welding techniques involve the utilization of heat and without dissipation of the heat the glass feedthrough's hermeticity as well as structural integrity is affected by the heat applied during welding. As an example, the welding temperature may be 1500° C. This is sufficient to melt sealing glass, which softens at approximately 700° C.

As mentioned hereinbefore, if the wall thickness 50 of frame wall 52 is 40 thousandths of an inch then the distance indicated by the double ended arrow 40 must also be on the order of 40 thousandths of an inch. Thus, while the distance of lead 54 from base 56 of the conventional package is in general dictated by the components within the package, the amount of metal in sidewall 52 between the top of the glass feedthrough and the bottom of the lid significantly contributes to package height.

Figure 3:
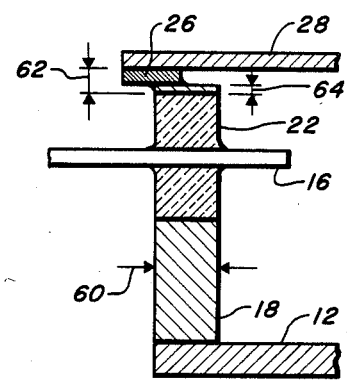
FIG. 3 is a cross-sectional view of the subject invention illustrating a decrease in the distance between the top of the feedthrough and the lid for the flat pack through the utilization of an offset ring.

Referring now to FIG. 3 in which like elements have like reference characters vis-a-vis FIG. 1, it can be seen that sidewall thickness indicated by double ended arrows 60 is in general the same for the sidewall shown in FIG. 2. Spacing indicated by double ended arrows 62 is considerably reduced due to the provision of offset ring 26 which, in some instances, can reduce the thickness of the metal of the sidewall 18 to that illustrated by double ended arrow 64, in one embodiment 15 thousandths of an inch, as opposed to 40 thousandths of an inch of the prior art.

Figure 4:
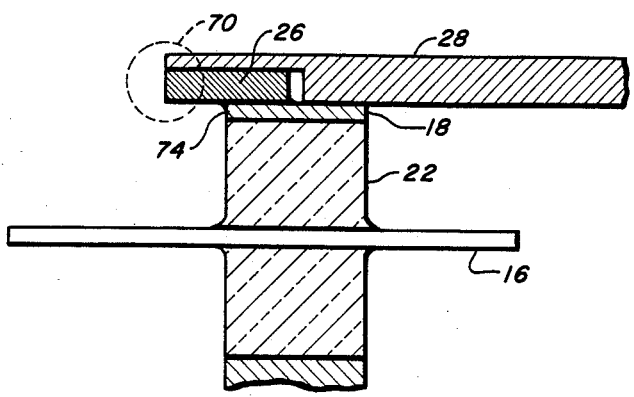
FIG. 4 is a cross-sectional view of the weld location for the offset ring and the lid of FIG. 3.
Figure 5:
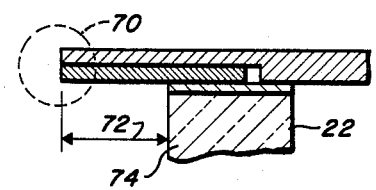
FIG. 5 is a diagrammatic illustration of the flange offset distance for the weld area for the offset ring of the subject invention.

Referring to FIGS. 4 and 5, it can be seen that for lid 28 and offset ring 26, the area designated by the dotted circle 70 is offset, as illustrated in FIG. 5 by arrow 72, from the outer sidewall 74 of frame 18.

As a general proposition, the further away from the sidewall that the welding area is, the less material 74 of frame 18 need be provided above the feedthrough. For practical packages, an extension or flange offset of 50 thousandths of an inch is sufficient for most welding processes and does not interfere with the mounting of the package to a suitable printed circuit board or other type of substrate.

Figure 6:
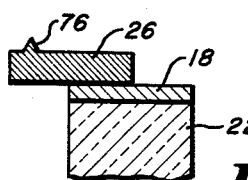
FIG. 6 is a cross-sectional diagram of an offset ring provided with a weld projection for use in welding a lid thereto.

Referring to FIG. 6, offset ring 26 may be provided with a weld projection or bump 76 which is utilized to provide the extra material necessary when welding lid 18 thereto.

Figure 7:
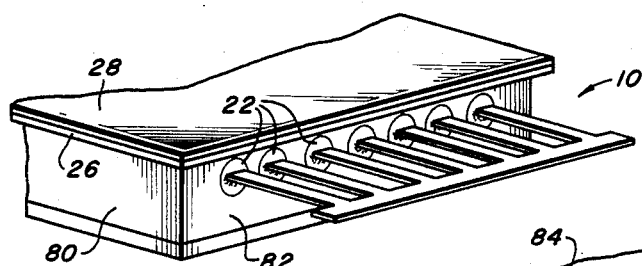
FIG. 7 is an isometric view of a portion of a flat package in which the offset ring serves as a flange completely surrounding the frame.
Figure 8:
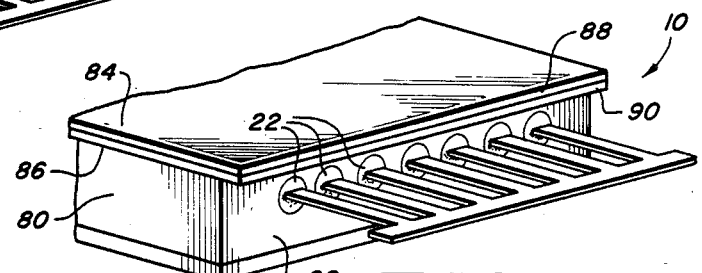
FIG. 8 is an isometric view of a portion of a flat package illustrating a side face of the offset ring flush with respect to the frame for areas in which no feedthroughs are located.
Figure 9:
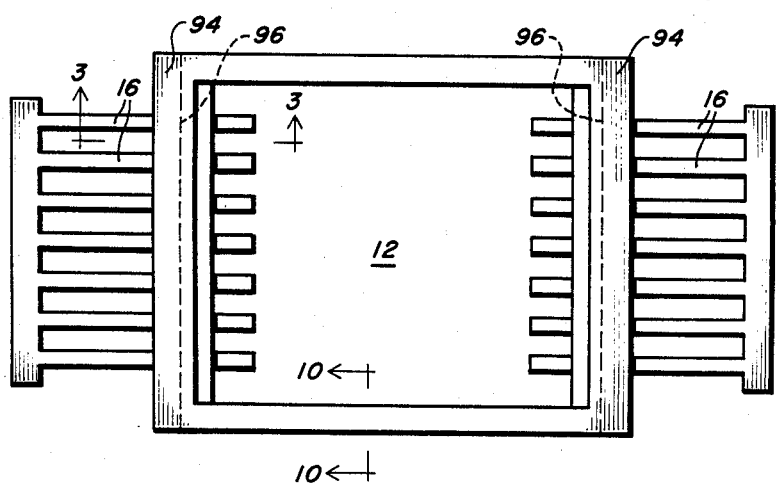
FIG. 9 is a top view of flat pack utilizing the subject ring in which the subject ring forms a flange only over those portions of the frame which carry feedthroughs.
Figure 10:
FIG. 10 is a sectional view of the flat pack of FIG. 9 illustrating the flush portion of the ring with respect to the frame sidewall for areas of the flat pack in which no feedthroughs are located.

Whether or not a weld projection is is used, the resulting package, or at least a portion thereof, is shown in FIG. 7 in which the combined periphery of the lid 28 and the offset weld ring 26 extends past the sidewalls 80 and 82 of package 10. However, as mentioned hereinbefore, ring 26 need not extend past sidewall 80 of package 10 or in those areas in which there are no feedthroughs. Thus, as illustrated in FIGS. 8 and 9, sidewalls 84 and 86 adjacent sidewall 80 are flush therewith, whereas edges 88 and 90 extend out from sidewall 82. As illustrated in FIG. 9, the portion of extension or flange width is illustrated at 94 to extend from the corresponding sidewalls 96 shown in dotted outline thereunder. Referring to FIG. 10, the flush nature of sidewall 80 and the edge 86 of ring 26 is clearly illustrated.

While the subject invention has been described in terms of flat packs utilizing Kovar frames, rings and lids, the subject invention is not limited thereto, since the offset ring provides for heat removal for any conventional welding process in which a lid is to be hermetically sealed by welding to a flat package having feedthroughs therethrough which involve either ceramic or glass materials. While the height reduction depends primarily on how close the lid may be spaced to the tops of the feedthroughs, the amount of metal or alloy above the feedthrough is of course determined by the frame material and the feedthrough material. It is, however, important to note that at least some metal or alloy must exist above the feedthrough for hermeticity purposes.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A method of minimizing package height for microcircuit packages comprising the steps of:
   providing a flat pack frame having at least one wall carrying at least one feedthrough;
   affixing an offset weld ring to the top surface of the flat pack frame, the weld ring extending past the wall of the flat pack frame carrying a feedthrough; and
   welding a lid to the offset weld ring at the periphery of the weld ring, whereby the heat of welding is removed from the feedthrough such that the distance between the top of the feedthrough to the top surface of the frame can be minimized.

2. The method of claim 1 wherein the lid is stepped at its periphery.

3. The method of claim 2 wherein the offset weld ring and the frame are made of the same material.

4. The method of claim 3 wherein said material is nickel-iron-cobalt alloy.

5. The method of claim 1 wherein the periphery of the lid matches that of the offset weld ring.

6. The method of claim 1 wherein the offset weld ring includes an annular weld projection.

7. The method of claim 1 wherein the offset weld ring is brazed to the frame.

8. The method of claim 1 wherein the offset weld ring is soldered to the frame.

9. The microcircuit package comprising:
   a rectangular frame having at least one upstanding well and an annular top surface such that said frame surrounds a predetermined area;
   a feedthrough mounted through said wall;
   a base secured to said frame;
   a separate offset weld ring secured to the top surface of said frame, said weld ring extending past the wall carrying said feedthrough; and
   a lid welded to the periphery of said weld ring.

10. The package of claim 9 wherein said lid is stepped at its periphery so that the central portion thereof extends into the area surrounded by said frame.

11. The package of claim 9 wherein said ring includes an annular weld projection.

12. The package of claim 9 wherein said ring, frame and lid are of nickel-iron-cobalt alloy and wherein the distance between the top of a feedthrough and the top surface of said frame is 15 thousandths of an inch.

* * * * *